United States Patent
Massa et al.

(10) Patent No.: US 7,449,723 B2
(45) Date of Patent: Nov. 11, 2008

(54) SEMICONDUCTOR DEVICE

(75) Inventors: John Stephen Massa, Ipswich (GB); Simon Andrew Wood, Burwell (GB)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 290 days.

(21) Appl. No.: 10/936,362

(22) Filed: Sep. 8, 2004

(65) Prior Publication Data

US 2005/0062032 A1 Mar. 24, 2005

(30) Foreign Application Priority Data

Sep. 20, 2003 (GB) ................. 0322053.0

(51) Int. Cl.
*H01L 33/00* (2006.01)

(52) U.S. Cl. ............ 257/97; 257/E33.01; 257/E33.024; 372/45.01

(58) Field of Classification Search .............. 257/97
See application file for complete search history.

(56) References Cited

U.S. PATENT DOCUMENTS

| 5,260,230 | A | 11/1993 | Kondo ..................... 437/129 |
| 5,404,027 | A | 4/1995 | Haase et al. .................. 257/13 |
| 5,956,358 | A | 9/1999 | Sasaki ......................... 372/45 |
| 6,664,605 | B1* | 12/2003 | Akulova et al. ............. 257/432 |
| 6,706,542 | B1* | 3/2004 | Geva et al. ..................... 438/7 |

FOREIGN PATENT DOCUMENTS

| GB | 2364600 | 1/2002 |
| GB | 1286439 | 2/2003 |
| JP | 5067849 | 3/1993 |
| JP | 2001044565 | 2/2001 |

* cited by examiner

*Primary Examiner*—Jerome Jackson, Jr.

(57) ABSTRACT

A semiconductor device is disclosed in which a barrier layer is deposited on the sides of the mesa. The barrier layer may comprise a semiconductor material. The barrier layer reduces diffusion of dopants into the active region of the device.

9 Claims, 3 Drawing Sheets

SEMICONDUCTOR DEVICE

FIELD OF THE INVENTION

The present invention relates to semiconductor devices and in particular to the processing of buried heterostructures to mitigate the unwanted diffusion of dopant atoms into the active region of a semiconductor device.

DISCUSSION OF THE BACKGROUND ART

Buried heterostructures (BHs) are used in a number of semiconductor devices, for example distributed feedback and Fabry-Perot lasers. A buried heterostructure is formed by etching a semiconductor wafer to form a mesa and then depositing overgrowth layers of semiconductor material around the sides of the mesa. Suitable selection of the materials and the doping of the overgrowth layers provide the desired performance of the device. It has been observed that the dopants from the overgrowth layers have a tendency to become deactivated from the overgrowth layers and then to diffuse out of the overgrowth layers. If some of these dopant atoms diffuse into the active region of the semiconductor device then the performance and reliability of the semiconductor device may be affected and the yield of the fabrication process will be reduced.

There have been a number of potential solutions to these problems, which attempt to prevent or reduce the diffusion of dopants and in particular the diffusion of zinc. These solutions have attempted to reduce the dopant concentration within the overgrowth layers or implementing multiple layered overgrowth layers comprising undoped layers or layers having graded dopant concentrations. It has been found that such solutions tend to have a limited effect in reducing the diffusion of dopants and can lead to poor device performance, such as increased device resistance and poor performance at high temperatures.

Our co-pending patent application EP 02253129.7 describes a technique in which an oxide layer is deposited on the sides of the mesa of a buried heterostructure. The oxide layer reduces dopant diffusion into the active layer.

SUMMARY OF THE INVENTION

According to a first aspect of the invention there is provided a semiconductor device comprising: a substrate; a first cladding layer formed on the semiconductor substrate; a multiple quantum well structure formed between the first cladding layer and a second cladding layer, the first cladding layer, the multiple quantum well structure and the second cladding layer being processed to form a mesa; and a barrier layer deposited on the sides of the mesa, characterised in that the barrier layer comprises semiconductor material.

In one embodiment of the invention the barrier layer comprises indium phosphide. The barrier layer may comprise an n-type dopant, which may be selected from sulphur, silicon, selenium or tin.

The device may further comprise one or more overgrowth layers formed on the sides of the mesa over the barrier layer. Additionally or alternatively the device may further comprise a first confinement layer and a second confinement layer, the first confinement layer being situated between the first cladding layer and the multiple quantum well structure and the second confinement layer being situated between the multiple quantum well structure and the second cladding layer.

The advantage of placing the semiconductor barrier layer on the sides of the mesa is that the barrier layer reduces the amount of dopant atoms diffusing into the MQW structure, and particularly dopants that diffuse from the overgrowth layers. The use of a semiconductor material as the barrier material is particularly advantageous as the barrier layer can be formed using the same techniques used to deposit the overgrowth layers. Prior art techniques of depositing an oxide layer require an additional process step when compared with the present invention.

The present invention also provides the further advantage over known techniques that attempt to reduce dopant diffusion into the active layer by altering the doping or composition of the materials used in the formation of the device. Such techniques tend to reduce dopant diffusion but the alterations tend to compromise the performance of the device in one or more further regards. By adding the barrier layer it is possible to reduce dopant diffusion without changing the composition of the rest of the device and thus there is no degradation of device performance.

A plurality of overgrowth layers may be deposited in the order: (i) n-type semiconductor; (ii) p-type semiconductor; (iii) intrinsic semiconductor; and (iv) n-type semiconductor. Alternatively the overgrowth layers may be deposited in the order: (i) n-type semiconductor; (ii) semi-insulating material; and (iii) n-type semiconductor. In a further alternative, the overgrowth layers may be deposited in the order: (i) n-type semiconductor; (ii) p-type semiconductor; (iii) n-type semiconductor; (iv) semi-insulating material; and (v) n-type semiconductor.

According to a second aspect of the invention there is provided a method of fabricating a semiconductor device, the method comprising the steps of: (a) forming a substrate; (b) forming a first cladding layer; (c) forming a multiple quantum well structure; (d) forming a second cladding layer; (e) etching the first cladding layer, the multiple quantum well structure and the second cladding layer to form a mesa; and (f) depositing a barrier layer on the sides of the mesa, the method being characterised in that the barrier layer deposited on the sides of the mesa comprises semiconductor material.

The method may further comprise the step of: (g) depositing one or more overgrowth layers on the sides of the mesa over the barrier layer.

Alternatively or additionally the method may further comprise the steps of: (h) forming a first confinement layer between the first cladding layer and the multiple quantum well structure; and (i) forming a second confinement layer between the multiple quantum well structure and the second cladding layer.

BRIEF DESRIPTION OF THE DRAWINGS

The invention will now be described, by way of example only, with reference to the following Figures in which.

DETAILED DESCRIPTION OF THE PREFERRED EMBODIMENT

Figure 1:
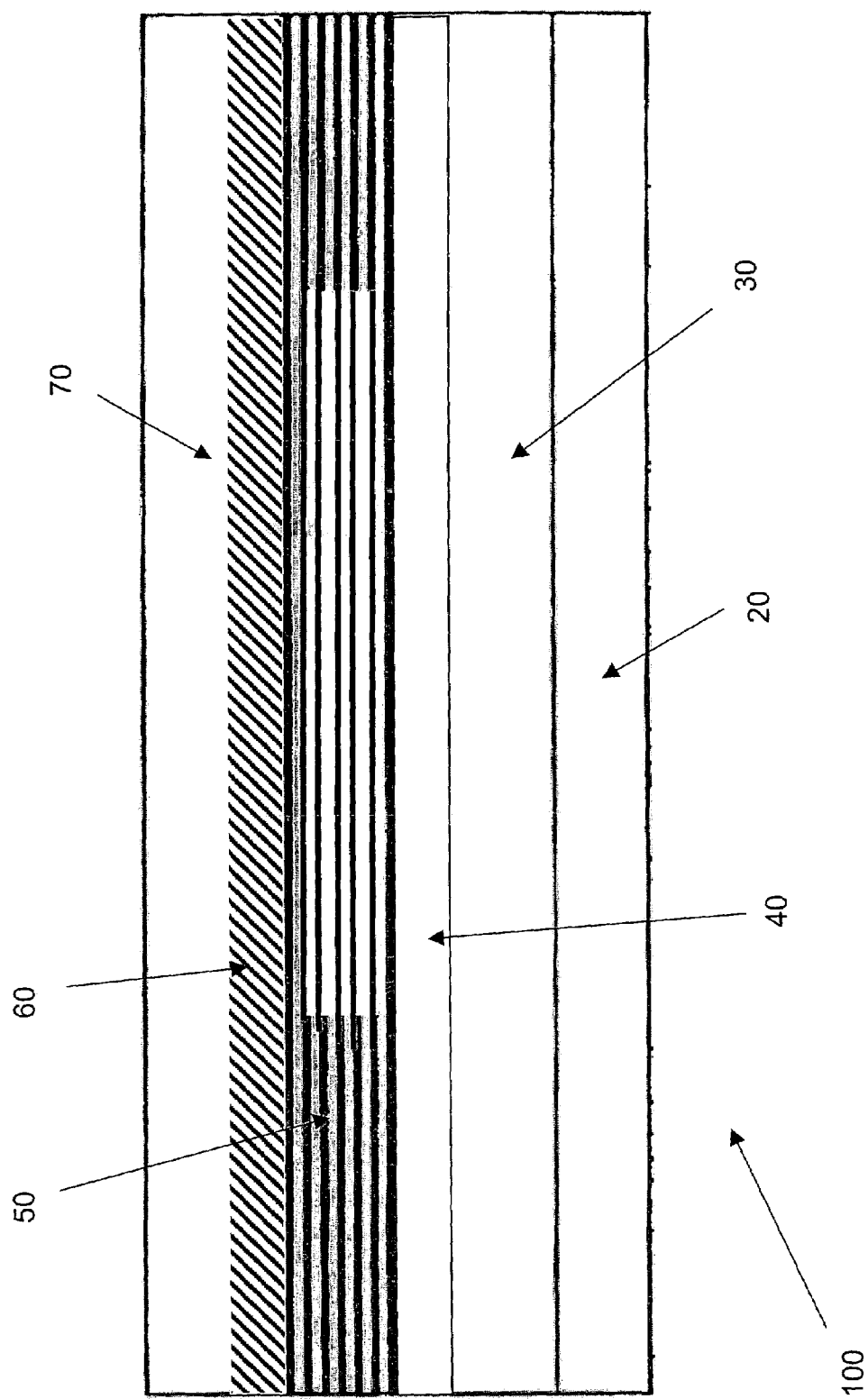
FIG. 1 shows a schematic depiction of a cross-section of a wafer of an integrated optical device according to the present invention.

FIG. 1 shows a schematic depiction of a wafer 100 from which a semiconductor device according to the present invention can be fabricated. The wafer 100 comprises an InP substrate 20 that is doped with an n-type dopant (with a doping density of approximately $4\times10^{18}$ cm$^{-3}$). A plurality of layers are formed on top of the substrate 20: lower cladding layer 30 comprises n-type InP with a thickness of about 1.5 µm and a doping density of approximately $2.5\times10^{18}$ cm$^{-3}$; an undoped first confinement layer 40 comprising InGaAsP lattice matched to InP; multiple quantum well structure 50 comprising undoped strained InGaAsP; second confinement layer 60 comprising undoped InGaAsP lattice matched to InP; and second cladding layer 70 comprising p-type InP with a thickness of about 0.4 µm and a doping density of approximately $1.5\times10^{18}$ cm$^{-3}$.

Figure 2:
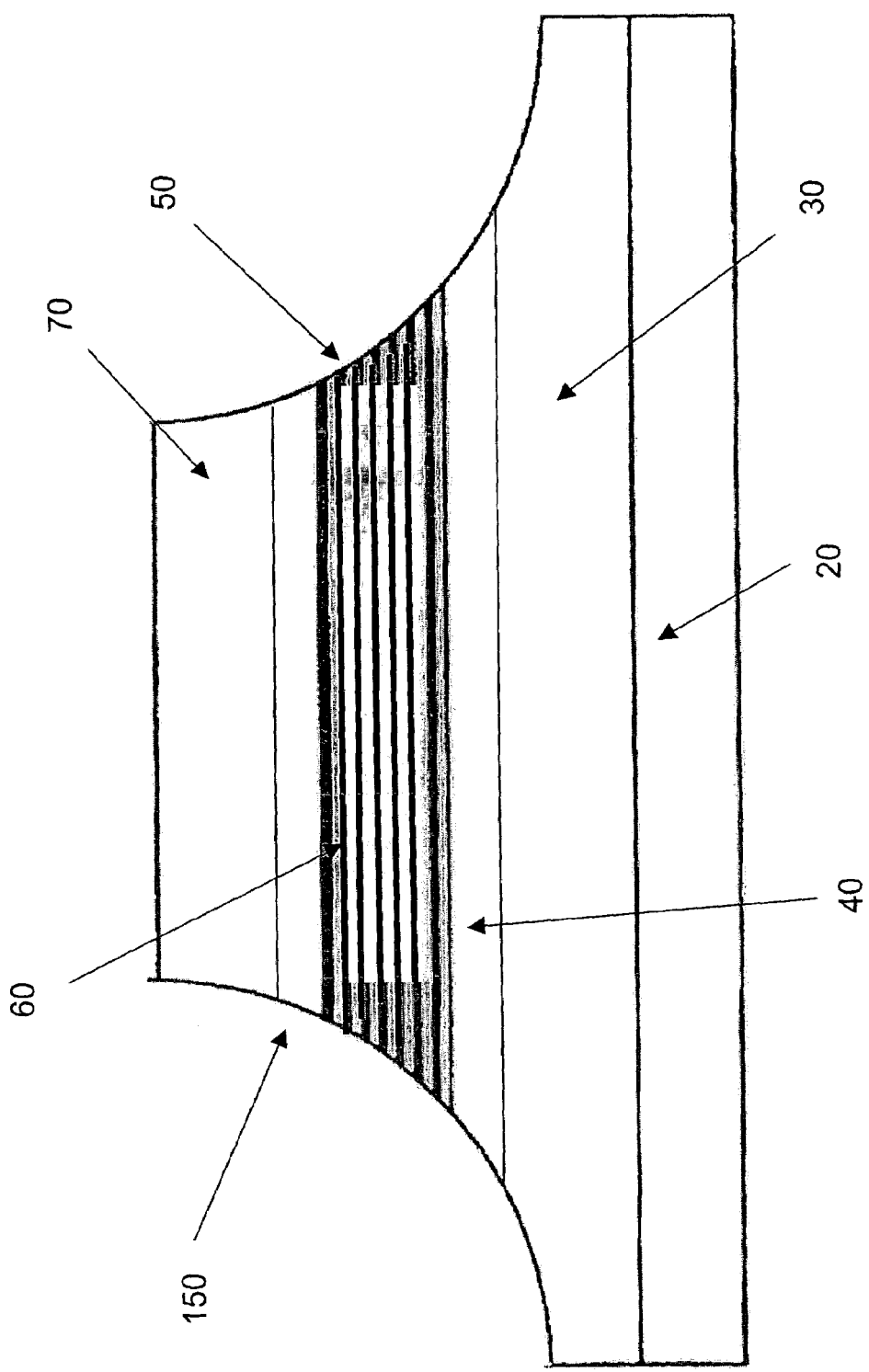
FIG. 2 shows a schematic depiction of the cross-section of an integrated optical device according to the present invention.
Figure 3:
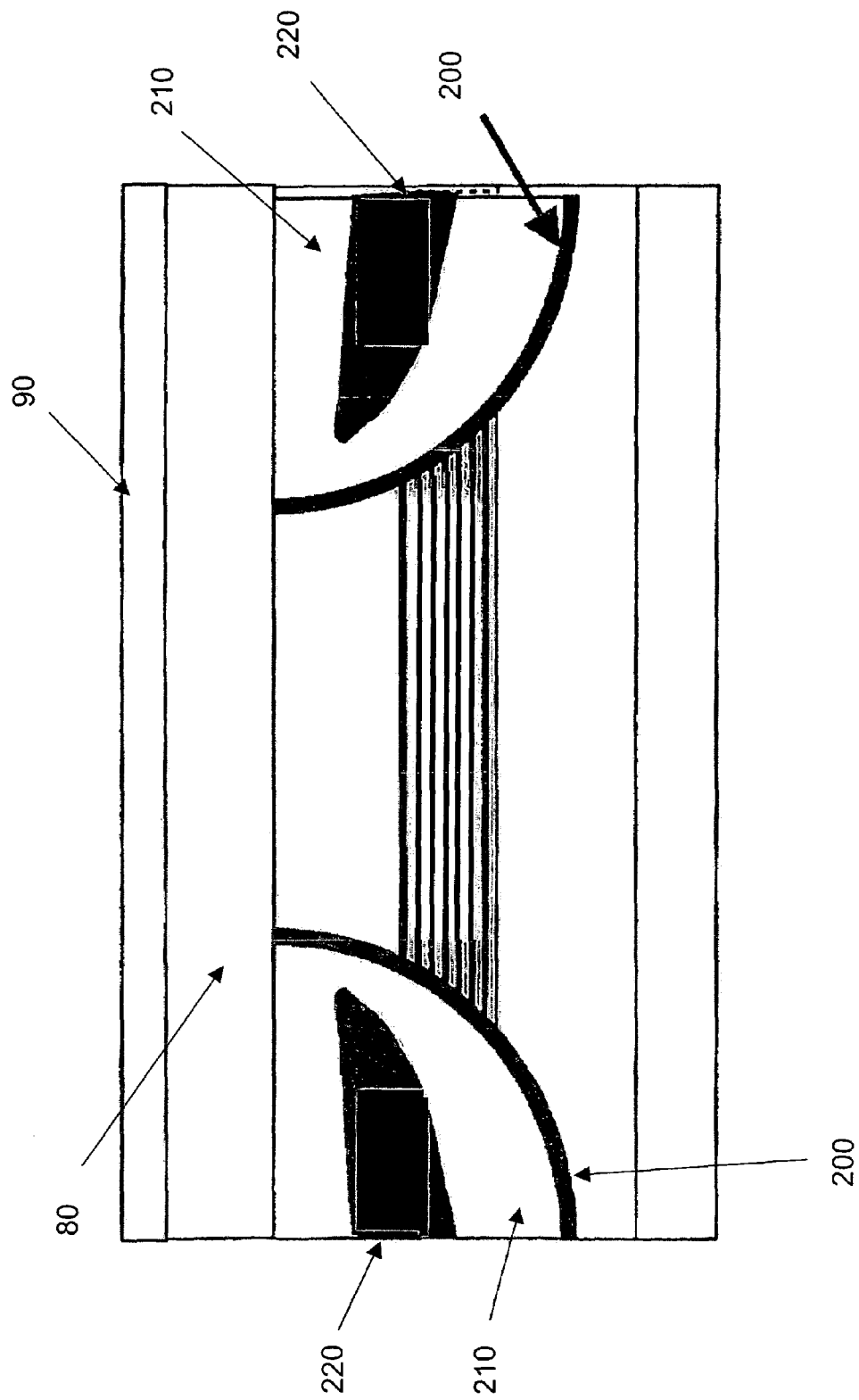
FIG. 3 shows a schematic depiction of a second cross-section of the integrated optical device of FIG. 2.

Once the wafer has been fabricated as described above with reference to FIG. 1, a laser stripe will be defined by photolithographically depositing an oxide mask on the second cladding surface. The wafer will then be etched using conventional techniques to form a mesa 150 approximately 1.5 µm wide and 1.5 µm tall (see FIG. 2).

The wafer is then returned to the growth reactor for the deposition of a barrier layer and one or more overgrowth layers. The barrier layer 200 comprises an epitaxial deposition of n-type InP that is deposited on the sides of the mesa. The thickness of the layer 200 may be between 10 and 100 nm thick but is preferably about 50 nm thick; it is important that the barrier layer is relatively thin in order to reduce the current leakage that may occur around the mesa. The doping density of the barrier layer may be within the range of $0.5\text{-}5.0\times10^{18}$ cm$^{-3}$ but is preferably about $2.5\times10^{18}$ cm$^{-3}$.

Further overgrowth layers are then deposited with first overgrowth layer 210 comprising p-type InP and second overgrowth layer 220 comprising n-type InP. Preferably the first overgrowth layer 210 has a thickness of approximately 0.8 µm and a doping density of approximately $1.5\times10^{18}$ cm$^{-3}$ and the second overgrowth layer 220 has a thickness of approximately 0.6 µm and a doping density of approximately $6\times10^{18}$ cm$^{-3}$.

The wafer is then removed from the growth reactor and the oxide patterning used to define the mesa is removed using conventional techniques. The wafer will be returned to the reactor where a third cladding layer 80 of p-type InP having a thickness of approximately 2 µm and a doping density of approximately $1\times10^{18}$ cm$^{-3}$ is deposited on top of the wafer, and on top of the third cladding layer a p-type InGaAs contact layer 90 is deposited, the contact layer 90 having a thickness of approximately 0.2 µm and a doping density of approximately $2\times10^{19}$ cm$^{-3}$.

Although the overgrowth process (including the deposition of the barrier layer) described above takes the order of n-p-n it has been found that it is also possible to deposit the overgrowth layers in the following orders: n-p-I-n; n-SI-n; or n-p-n-SI-n (where I indicates intrinsic material and SI semi-insulating material [such as InP doped with iron, titanium or ruthenium]).

The function of the barrier layer 200 is to absorb zinc so as to reduce the diffusion of zinc into the active region. Thus, other materials may be used if they have a high zinc solubility and are compatible with processes and materials used to form the device. It is believed that GaAs could be used to form the barrier layer, but as this cannot be lattice matched to InP this may lead to reliability problems.

It will be readily apparent to the person skilled in the art that the devices described above may be fabricated using different choices of materials and dopants and that different choices of layer thickness and doping concentration may be made without substantially effecting the functionality of the devices.

What is claimed is:

1. A semiconductor device comprising:
a substrate;
a first cladding layer formed on the substrate;
a multiple quantum well structure formed between the first cladding layer and a second cladding layer, the first cladding layer, the multiple quantum well structure and the second cladding layer being processed to form a mesa;
a barrier layer deposited on the sides of the mesa, wherein the barrier layer comprises semiconductor material and an n-type dopant selected from the group consisting of sulfur, silicon, selenium, copper and tin; and
overgrowth layers deposited on the sides of the mesa over the barrier layer in the order: (i) n-type semiconductor; (ii) p-type semiconductor; (iii) intrinsic semiconductor; and (iv) n-type semiconductor.

2. A semiconductor device according to claim 1, wherein the barrier layer comprises indium phosphide.

3. A semiconductor device comprising:
a first cladding layer formed on a substrate;
a multiple quantum well structure formed between the first cladding layer and a second cladding layer, the first cladding layer, the multiple quantum well structure and the second cladding layer being processed to form a mesa;
a barrier layer deposited on the sides of the mesa, wherein the barrier layer comprises semiconductor material and an n-type dopant selected from the group consisting of sulfur, silicon, selenium, copper and tin; and
overgrowth layers deposited on the sides of the mesa over the barrier layer in the order: (i) n-type semiconductor; (ii) semi-insulating material; and (iii) n-type semiconductor.

4. A semiconductor device comprising:
a first cladding layer formed on a substrate;
a multiple quantum well structure formed between the first cladding layer and a second cladding layer, the first cladding layer, the multiple quantum well structure and the second cladding layer being processed to form a mesa;
a barrier layer deposited on the sides of the mesa, wherein the barrier layer comprises semiconductor material and an n-type dopant selected from the group consisting of sulfur, silicon, selenium, copper and tin; and
overgrowth layers deposited on the sides of the mesa over the barrier layer in the order: (i) n-type semiconductor; (ii) p-type semiconductor; (iii) n-type semiconductor; (iv) semi-insulating material; and (v) n-type semiconductor.

5. A semiconductor device according to claim 1, wherein the device further comprises a first confinement layer and a second confinement layer, the first confinement layer being situated between the first cladding layer and the multiple quantum well structure and the second confinement layer being situated between the multiple quantum well structure and the second cladding layer.

6. A semiconductor device according to claim 3, wherein the barrier layer comprises indium phosphide.

7. A semiconductor device according to claim 3, wherein the device further comprises a first confinement layer and a second confinement layer, the first confinement layer being situated between the first cladding layer and the multiple quantum well structure and the second confinement layer being situated between the multiple quantum well structure and the second cladding layer.

8. A semiconductor device according to claim 4, wherein the barrier layer comprises indium phosphide.

9. A semiconductor device according to claim 4, wherein the device further comprises a first confinement layer and a second confinement layer, the first confinement layer being situated between the first cladding layer and the multiple quantum well structure and the second confinement layer being situated between the multiple quantum well structure and the second cladding layer.

\* \* \* \* \*

UNITED STATES PATENT AND TRADEMARK OFFICE
CERTIFICATE OF CORRECTION

PATENT NO.       : 7,449,723 B2
APPLICATION NO.  : 10/936362
DATED            : November 11, 2008
INVENTOR(S)      : John Stephen Massa et al.

It is certified that error appears in the above-identified patent and that said Letters Patent is hereby corrected as shown below:

Title page item [56]

Column 1, under the Title and before "FIELD OF THE INVENTION",
     insert -- Foreign Application Priority Data
         Sep. 20, 2003   [GB]   0322053.0 --.

Signed and Sealed this

Thirtieth Day of November, 2010

David J. Kappos
*Director of the United States Patent and Trademark Office*